(12) United States Patent
Son et al.

(10) Patent No.: US 9,087,953 B2
(45) Date of Patent: Jul. 21, 2015

(54) SOLAR CELL MODULE AND METHOD FOR MANUFACTURING THE SAME

(75) Inventors: Jeonghun Son, Seoul (KR); Seungjoon Lee, Seoul (KR); Heonmin Lee, Seoul (KR); Taeho Moon, Seoul (KR); Wonki Yoon, Seoul (KR); Jinhee Park, Seoul (KR); Sehwon Ahn, Seoul (KR); Youngjoo Eo, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 194 days.

(21) Appl. No.: 12/899,261

(22) Filed: Oct. 6, 2010

(65) Prior Publication Data

US 2011/0079264 A1   Apr. 7, 2011

(30) Foreign Application Priority Data

Oct. 7, 2009   (KR) .................. 10-2009-0095217

(51) Int. Cl.
| *H01L 31/18* | (2006.01) |
| *H01L 31/0352* | (2006.01) |
| *H01L 31/046* | (2014.01) |
| *H01L 31/042* | (2014.01) |

(52) U.S. Cl.
CPC ............ *H01L 31/18* (2013.01); *H01L 31/0352* (2013.01); *H01L 31/046* (2014.12); *H01L 31/042* (2013.01); *Y02E 10/52* (2013.01)

(58) Field of Classification Search
USPC ........................................ 136/244
See application file for complete search history.

(56) References Cited

U.S. PATENT DOCUMENTS

| 4,281,208 | A | * | 7/1981 | Kuwano et al. ................ 136/244 |
| 4,799,968 | A | * | 1/1989 | Watanabe et al. ............. 136/258 |
| 4,981,525 | A | * | 1/1991 | Kiyama et al. ................ 136/244 |
| 5,268,037 | A | * | 12/1993 | Glatfelter ....................... 136/249 |
| 6,294,722 | B1 | * | 9/2001 | Kondo et al. .................. 136/244 |
| 6,750,394 | B2 | * | 6/2004 | Yamamoto et al. ........... 136/258 |
| 2002/0066478 | A1 | * | 6/2002 | Hayashi et al. ................ 136/244 |
| 2006/0196536 | A1 | | 9/2006 | Fujioka et al. |
| 2009/0065060 | A1 | | 3/2009 | Yonezawa et al. |
| 2009/0229653 | A1 | * | 9/2009 | Lu et al. ......................... 136/249 |
| 2010/0282303 | A1 | | 11/2010 | Park et al. |
| 2011/0162684 | A1 | | 7/2011 | Kim et al. |

FOREIGN PATENT DOCUMENTS

| CN | 101542750 A | 9/2009 |
| JP | 2006-332190 A | 12/2006 |
| KR | 10-2009-0014450 A | 2/2009 |
| KR | 10-2009-0073308 A | 7/2009 |
| WO | WO 2009/084888 A2 | 7/2009 |

* cited by examiner

*Primary Examiner* — Shannon Gardner
(74) *Attorney, Agent, or Firm* — Birch, Stewart, Kolasch & Birch, LLP

(57) ABSTRACT

A solar cell module and a method for manufacturing the same are discussed. The solar cell module includes a substrate including an electricity generation area and an edge area that are divided by an insulating area, and a plurality of solar cells positioned in the electricity generation area. Each of the solar cells includes a transparent electrode on the substrate, a silicon electricity generation layer on the transparent electrode, and a back electrode on the silicon electricity generation layer. The back electrode of one solar cell is electrically connected to the transparent electrode of another solar cell adjacent to the one solar cell. A side of a transparent electrode of an outermost solar cell adjacent to the insulating area is covered by a side portion of a silicon electricity generation layer of the outermost solar cell exposed in the insulating area.

11 Claims, 3 Drawing Sheets

SOLAR CELL MODULE AND METHOD FOR MANUFACTURING THE SAME

This application claims priority to and the benefit of Korean Patent Application No. 10-2009-0095217 filed in the Korean Intellectual Property Office on Oct. 7, 2009, the entire contents of which are incorporated herein by reference.

BACKGROUND OF THE INVENTION

1. Field of the Invention

Exemplary embodiments of the invention relate to a solar cell module and a method for manufacturing the same.

2. Description of the Related Art

Recently, as existing energy sources such as petroleum and coal are expected to be depleted, interests in renewable energy for replacing the existing energy sources are increasing. As the renewable energy, solar cells for generating electric energy from solar energy have been particularly spotlighted.

Single crystal bulk silicon using a silicon wafer, etc., has been now commercialized, but has not been put to practical use because of its high manufacturing cost.

To solve such a problem, recently, a thin film solar cell has been actively studied. In particular, a thin film solar cell using hydrogenated amorphous silicon (a-Si:H) is used to manufacture a large-sized solar cell module at a low price and thus has attracted much attention.

A thin film solar cell module including a plurality of thin film solar cells has an electricity generation area in which the plurality of thin film solar cells are formed, an edge area formed around the electricity generation area, and an insulating area for dividing between the electricity generation area and the edge area.

An unnecessary current path formed by again depositing or redepositing conductive materials (for example, a transparent conductive layer) removed by performing a scribing process on a substrate is required to be minimized, so that an electricity generation efficiency of the thin film solar cell module increases when the thin film solar cell module having the above-described configuration is manufactured.

SUMMARY OF THE INVENTION

In one aspect, there is a solar cell module including a substrate including an electricity generation area and an edge area that are divided by an insulating area and a plurality of solar cells positioned in the electricity generation area. Each of the plurality of solar cells includes a transparent electrode positioned on the substrate, a silicon electricity generation layer positioned on the transparent electrode, and a back electrode positioned on the silicon electricity generation layer, the back electrode of one solar cell being electrically connected to the transparent electrode of another solar cell adjacent to the one solar cell. A side of a transparent electrode of an outermost solar cell adjacent to the insulating area is covered by a side portion of a silicon electricity generation layer of the outermost solar cell exposed in the insulating area.

A side of a back electrode of the outermost solar cell is aligned with the side portion of the silicon electricity generation layer of the outermost solar cell. When each of the plurality of solar cells further includes a back reflection layer between the silicon electricity generation layer and the back electrode, a side of a back reflection layer of the outermost solar cell is aligned with the side portion of the silicon electricity generation layer and the side of the back electrode of the outermost solar cell.

Respective portions of a transparent conductive layer for forming the transparent electrode, a silicon thin film layer for forming the silicon electricity generation layer, and a back electrode layer for forming the back electrode are sequentially formed on the substrate in the edge area. A side of the portion of the transparent conductive layer is covered by a side portion of the portion of the silicon thin film layer exposed in the insulating area.

A distance between the portion of the transparent conductive layer positioned in the edge area and the transparent electrode of the outermost solar cell is greater than a width of the insulating area.

A side of the portion of the back electrode layer exposed in the insulating area is aligned with the side of the silicon thin film layer. When a portion of a back reflection layer is positioned between the portion of the silicon thin film layer and the portion of the back electrode layer, a side of the portion of the back reflection layer exposed in the insulating area is aligned with the side of the portion of the silicon thin film layer and the side of the portion of the back electrode layer.

The transparent conductive layer and the transparent electrode are formed of a metal oxide. The metal oxide includes at least one material selected among tin dioxide (SnO2), zinc oxide (ZnO), and indium tin oxide (ITO).

In another aspect, there is a method for manufacturing a solar cell module including depositing and patterning a transparent conductive layer on a substrate, depositing and patterning a silicon thin film layer on the transparent conductive layer, depositing and patterning a back electrode layer on the silicon thin film layer, and forming an insulating area dividing between an electricity generation area and an edge area of the substrate. The patterning of the transparent conductive layer includes removing a portion of the transparent conductive layer positioned in at least the insulating area so that a width of the removed portion of the transparent conductive layer is greater than a width of the insulating area.

The patterning of the transparent conductive layer includes forming a plurality of transparent electrodes through a first scribing process. The removing of the portion of the transparent conductive layer is performed through the first scribing process.

The patterning of the silicon thin film layer includes forming a plurality of silicon electricity generation layers through a second scribing process. The patterning of the hack electrode layer includes forming a plurality of back electrodes through a third scribing process. The forming of the insulating area includes removing portions of the silicon thin film layer and the back electrode layer positioned in the insulating area through a fourth scribing process.

Before the fourth scribing process is performed, an alignment process is performed. The method further includes forming a back reflection layer between the silicon thin film layer and the back electrode layer. A portion of the back reflection layer positioned in the insulating area is removed through the fourth scribing process.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
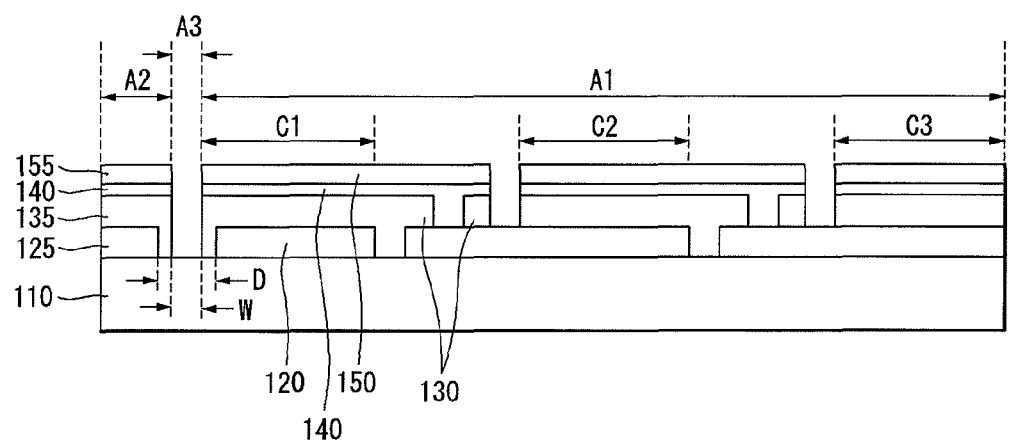
FIG. 1 is a partial cross-sectional view of a solar cell module according to an example embodiment of the invention.

The invention will be described more fully hereinafter with reference to the accompanying drawings, in which example embodiments of the inventions are shown. This invention may, however, be embodied in many different forms and should not be construed as limited to the embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when an element such as a layer, film, region, or substrate is referred to as being "entirely" on another element, it may be on the entire surface of the other element and may not be on a portion of an edge of the other element.

Reference will now be made in detail to embodiments of the invention, examples of which are illustrated in the accompanying drawings.

FIG. 1 is a partial cross-sectional view of a solar cell module according to an example embodiment of the invention.

A solar cell module according to an example embodiment of the invention includes a substrate 110 having an electricity generation area A1, an edge area A2, and an insulating area A3 dividing between the areas A1 and A2.

Although FIG. 1 shows one edge area A2 and one insulating area A3, the areas A2 and A3 may be included in one or more border areas of the substrate 110.

A plurality of solar cells C1, C2 and C3, for example, are positioned on the substrate 110 in the electricity generation area A1. Each of the solar cells C1, C2 and C3 includes a transparent electrode 120, a silicon electricity generation layer 130, a back reflection layer 140, and a back electrode 150 that are sequentially stacked on the substrate 110. The back reflection layer 140 may be removed, if desired.

The transparent electrode 120 may be formed of metal oxide, for example, at least one material selected among tin dioxide ($SnO_2$), zinc oxide (ZnO), and indium tin oxide (ITO). Further, the transparent electrode 120 may be formed of a mixture obtained by mixing at least one kind of impurities with the metal oxide.

The silicon electricity generation layer 130 may be formed of an amorphous silicon-based thin film (for example, a p-i-n thin film) or a tandem type silicon thin film layer in which the amorphous silicon-based thin film and a microcrystalline silicon-based thin film are stacked.

When the silicon electricity generation layer 130 is formed of the tandem type silicon thin film layer, a middle transparent conductive layer may be formed between the amorphous silicon-based thin film and the microcrystalline silicon-based thin film. The silicon electricity generation layer 130 may have various structures other than the structure described in the example embodiment of the invention.

The back electrode 150 may be formed of, for example, one metal selected among gold (Au), silver (Ag), and aluminum (Al). The back electrode 150 of one solar cell is electrically connected to the transparent electrode 120 of another solar cell adjacent to the one solar cell. For example, as shown in FIG. 1, the back electrode 150 of the outermost solar cell C1 adjacent to the insulating area A3 is electrically connected to the transparent electrode 120 of the solar cell C2 adjacent to the outermost solar cell C1 through the back reflection layer 140 of the outermost solar cell C1.

If the back reflection layer 140 is omitted, the back electrode 150 is directly connected to the transparent electrode 120 of the adjacent solar cell. Thus, the plurality of solar cells C1, C2 and C3 are connected in series to one another.

Thin films having the same interlayer structure as the solar cell are deposited in the edge area A2. In other words, a transparent conductive layer 125 for forming the transparent electrode 120, a silicon thin film layer 135 for forming the silicon electricity generation layer 130, the back reflection layer 140, and a back electrode layer 155 for forming the back electrode 150 are sequentially formed on the substrate 110 in the edge area A2.

In the solar cell module having the above-described structure, a distance D between the transparent conductive layer 125 positioned in the edge area A2 and the transparent electrode 120 of the outermost solar cell C1 is greater than a width W of the insulating area A3.

Thus, a side of the transparent conductive layer 125 facing the insulating area A3 in the transparent conductive layer 125 positioned in the edge area A2 is covered by a side (or a portion) of the silicon thin film layer 135 exposed (or having an exposed portion) in the insulating area A3. Further, a side of the transparent electrode 120 facing the insulating area A3 in the transparent electrode 120 of the outermost solar cell C1 is covered by a side (or a portion) of the silicon electricity generation layer 130 of the outermost solar cell C1 exposed (or having an exposed portion) in the insulating area A3.

Sides of the back reflection layer 140 and the back electrode layer 155 positioned in the edge area A2 are agreed (aligned or flush) with the side of the silicon thin film layer 135 exposed in the insulating area A3. Further, sides of the back reflection layer 140 and the back electrode 150 of the outermost solar cell C1 are (aligned or flush) with the side of the silicon electricity generation layer 130 exposed in the insulating area A3.

Processes in a method for manufacturing the solar cell module according to the example embodiment of the invention are described below with reference to FIGS. 1 to 7. FIGS. 2 to 7 are cross-sectional views sequentially illustrating processes in a method for manufacturing the solar cell module according to the example embodiment of the invention.

Figure 2:
FIGS. 2 to 7 are cross-sectional views sequentially illustrating processes in a method for manufacturing a solar cell module according to an example embodiment of the invention.

To manufacture the solar cell module shown in FIG. 1, first, as shown in FIG. 2, the transparent conductive layer 125 is deposited on the entire surface of the substrate 110.

In the example embodiment of the invention, the transparent conductive layer 125 may be formed of metal oxide, for example, at least one material selected among tin dioxide ($SnO_2$), zinc oxide (ZnO), and indium tin oxide (ITO). Further, the transparent conductive layer 125 may be formed of a mixture obtained by mixing at least one kind of impurities with the metal oxide.

Figure 3:
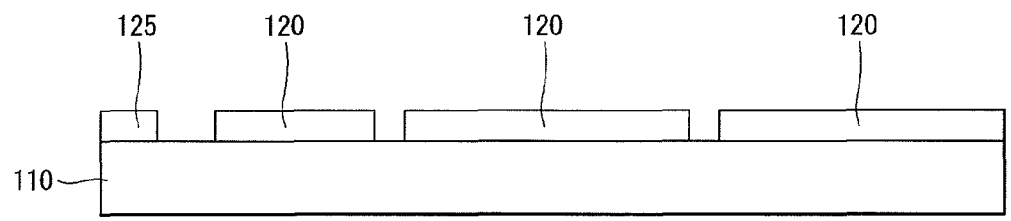

Next, as shown in FIG. 3, the transparent conductive layer 125 is patterned to form the plurality of transparent electrodes 120 on the substrate 110 in the electricity generation area A1.

The patterning of the transparent conductive layer 125 may be performed through a first scribing process. The first scribing process is a process for irradiating a laser from a lower surface of the substrate 110 to the inside of the substrate 110 to evaporate a portion of the transparent conductive layer 125 in a predetermined area. As the first scribing process is performed, the plurality of transparent electrodes 120 are formed in the electricity generation area A1 to be spaced apart from one another at a constant distance, for example.

In a related art, the first scribing process was performed on only the transparent conductive layer 125 positioned in the electricity generation area A1. However, in the example embodiment of the invention, the first scribing process is performed on the transparent conductive layer 125 positioned in the insulating area A3 as well as the transparent conductive layer 125 positioned in the electricity generation area A1.

When a portion of the transparent conductive layer 125 positioned in the insulating area A3 is removed through the first scribing process, a width (corresponding to a distance D) of the transparent conductive layer 125 removed through the first scribing process is greater than the width W of the insulating area A3 formed in a subsequent process. Thus, the distance D between the transparent conductive layer 125 positioned in the edge area A2 and the transparent electrode 120 of the outermost solar cell C1 is greater than the width W of the insulating area A3.

As described above, a reason why the distance D between the transparent conductive layer 125 and the transparent electrode 120 is greater than the width W of the insulating area A3 is to secure an alignment margin when the insulating area A3 is formed through a fourth scribing process which will be described later. This will be described in detail later.

Figure 4:
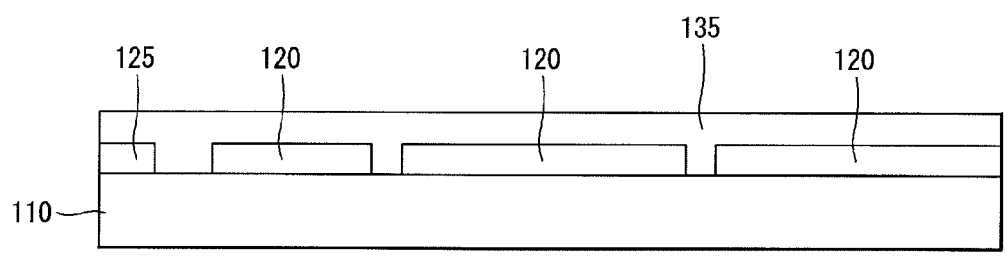

After the above-described first scribing process is performed, and as shown in FIG. 4, the silicon thin film layer 135 is deposited on the substrate 110. In this case, the silicon thin film layer 135 is filled in a space between the transparent electrodes 120.

The silicon thin film layer 135 may be formed of the amorphous silicon-based thin film (for example, the p-i-n thin film) or the tandem type silicon thin film layer in which the amorphous silicon-based thin film and the microcrystalline silicon-based thin film are stacked.

When the silicon thin film layer 135 is formed of the tandem type silicon thin film layer, the middle transparent conductive layer may be formed between the amorphous silicon-based thin film and the microcrystalline silicon-based thin film. The silicon thin film layer 135 may have various structures other than the structure described in the example embodiment of the invention.

Figure 5:
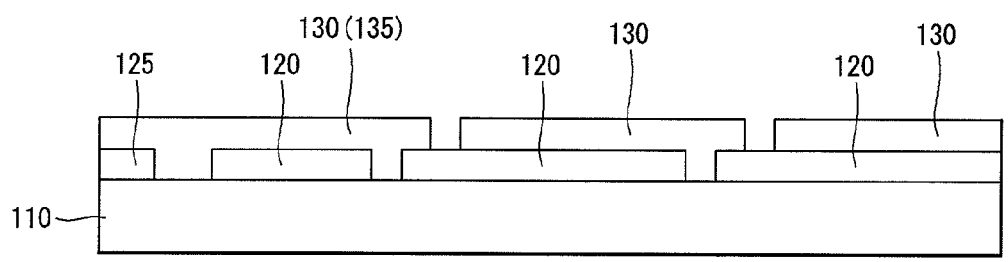

Next, as shown in FIG. 5, the silicon thin film layer 135 is patterned to form the plurality of silicon electricity generation layers 130 on the substrate 110 in the electricity generation area A1. The patterning of the silicon thin film layer 135 may be performed through a second scribing process.

An output of a laser used in the second scribing process is less than an output of the laser used in the first scribing process. Thus, when the second scribing process is performed by irradiating the laser from the lower surface of the substrate 110 to the inside of the substrate 110, the transparent electrodes 120 in the electricity generation area A1 are not evaporated. However, a portion of the silicon thin film layer 135 on the transparent electrodes 120 in the electricity generation area A1 is evaporated and removed. Hence, the plurality of silicon electricity generation layers 130 are formed in the electricity generation area A1 to be spaced apart from one another at a constant distance, for example.

Figure 6:
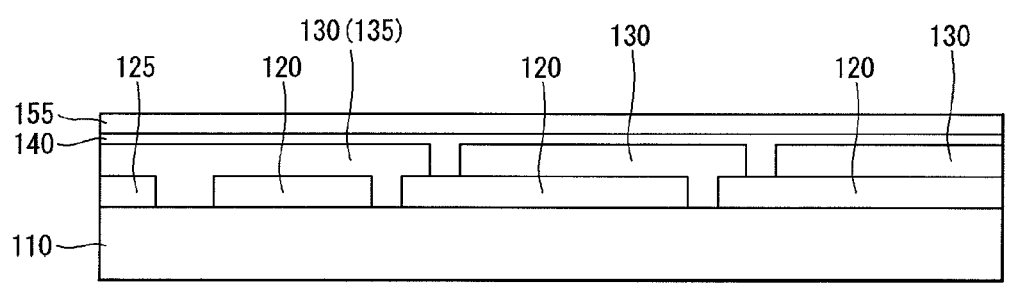

After the above-described second scribing process is performed, and as shown in FIG. 6, the back reflection layer 140 and the back electrode layer 155 are sequentially deposited. In this case, the back reflection layer 140 and/or the back electrode layer 155 are filled in a space between the silicon electricity generation layers 130. In FIG. 6, shown is the back reflection layer 140 being filled in the space between the silicon electricity generation layers 130. Thus, the back electrode 150 is electrically connected to the transparent electrode 120 of the adjacent solar cell.

The back electrode layer 155 may be formed of, for example, one metal selected among gold (Au), silver (Ag), and aluminum (Al).

Figure 7:
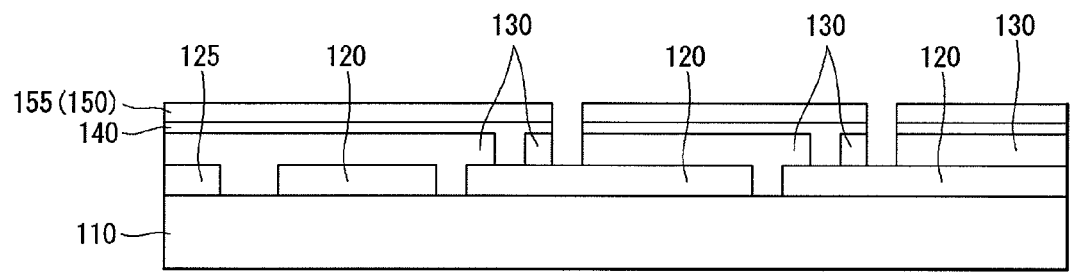

Next, as shown in FIG. 7, the back reflection layer 140 and the back electrode layer 155 are patterned to form the plurality of back electrodes 150 in the electricity generation area A1. The patterning of the back reflection layer 140 and the back electrode layer 155 may be performed through a third scribing process.

An output of a laser used in the third scribing process is less than an output of the laser used in the second scribing process. Thus, when the third scribing process is performed by irradiating the laser from the lower surface of the substrate 110 to the inside of the substrate 110, and the transparent electrodes 120 in the electricity generation area A1 is not evaporated. However, portions of the silicon electricity generation layers 130, the back reflection layer 140 and the back electrode layer 155 in the electricity generation area A1 are evaporated and removed. Hence, the plurality of back electrodes 150 are formed in the electricity generation area A1 to be spaced apart from one another at a constant distance.

After the above-described third scribing process is performed, the fourth scribing process for forming the insulating area A3 is performed. The fourth scribing process is performed after an alignment process using an alignment mark is performed. As the fourth scribing process is performed, the insulating area A3 is formed so that the width W of the insulating area A3 is less than the distance D between the transparent conductive layer 125 positioned in the edge area A2 and the transparent electrode 120 of the outermost solar cell C1. Hence, the alignment margin is secured during the fourth scribing process. As a result, the transparent conductive layer 125 and the transparent electrode 120 are prevented from being evaporated by the laser during the fourth scribing process.

However, if the alignment process can be accurately performed, the width W of the insulating area A3 may be equal to the distance D between the transparent conductive layer 125 and the transparent electrode 120.

In the manufacturing method according to the example embodiment of the invention, only the silicon thin film layer and the back electrode layer (selectively including the back reflection layer) may be removed in the fourth scribing process for forming the insulating area A3.

In the example embodiment of the invention, because a portion of atoms of a material of the transparent conductive layer can be prevented from being again deposited or redeposited on the silicon electricity generation layer and the back electrode layer in the fourth scribing process, an unnecessary current path formed by the redeposited atoms of the material of the transparent conductive layer is prevented. Hence, the electricity generation efficiency can increase.

Although embodiments have been described with reference to a number of illustrative embodiments thereof, it should be understood that numerous other modifications and embodiments can be devised by those skilled in the art that will fall within the scope of the principles of this, disclosure.

More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell module, comprising:
   continuous one substrate including an electricity generation area and an edge area that are divided by an insulating area;
   a plurality of transparent electrodes positioned on the continuous one substrate in the electricity generation area;
   a plurality of silicon electricity generation layers positioned in the electricity generation area, each silicon electricity generation layer of the plurality of silicon electricity generation layers positioned on each transparent electrode of the plurality of transparent electrodes; and
   a plurality of back electrodes positioned in the electricity generation area, each back electrode of the plurality of back electrodes positioned on each silicon electricity generation layer of the plurality of silicon electricity generation layers and a back electrode of one solar cell being electrically connected to a transparent electrode of another solar cell adjacent to the one solar cell,
   wherein the edge area is positioned at a periphery of the continuous one substrate, and the transparent electrodes, the silicon electricity generation layers and the back electrodes are not positioned in the insulating area,
   wherein at least one dummy cell including a transparent conductive layer, a silicon thin film layer, and a back electrode layer is formed on the continuous one substrate in the edge area,
   wherein the at least one dummy cell is electrically disconnected to an outermost solar cell, and
   wherein a side of a transparent electrode of the outermost solar cell adjacent to the insulating area is covered by a side portion of a silicon electricity generation layer of the outermost solar cell exposed in the insulating area, and a side of the portion of the transparent conductive layer is covered by a side portion of the portion of the silicon thin film layer exposed in the insulating area.

2. The solar cell module of claim 1, wherein a side of a back electrode of the outermost solar cell is aligned with the side portion of the silicon electricity generation layer of the outermost solar cell.

3. The solar cell module of claim 2, further comprising a plurality of back reflection layers positioned in the electricity generation area, each back reflection layer of the plurality of back reflection layers positioned between the silicon electricity generation layers and the back electrodes, and
   a side of a back reflection layer of the outermost solar cell is aligned with the side portion of the silicon electricity generation layer and the side of the back electrode of the outermost solar cell.

4. The solar cell module of claim 1, wherein a distance between the portion of the transparent conductive layer positioned in the edge area and the transparent electrode of the outermost solar cell is greater than a width of the insulating area.

5. The solar cell module of claim 4, wherein a side of the portion of the back electrode layer exposed in the insulating area is aligned with the side of the silicon thin film layer.

6. The solar cell module of claim 5, further comprising a back reflection layer positioned between the silicon thin film layer and the back electrode layer in the edge layer, and
   a side of the portion of the back reflection layer exposed in the insulating area is aligned with the side of the portion of the silicon thin film layer and the side of the portion of the back electrode layer.

7. The solar cell module of claim 6, wherein the transparent conductive layer and the transparent electrode are formed of a metal oxide.

8. The solar cell module of claim 7, wherein the metal oxide includes at least one material selected among tin dioxide ($SnO_2$), zinc oxide (ZnO), and indium tin oxide (ITO).

9. The solar cell module of claim 1, wherein the side portion of the silicon electricity generation layer of the outermost solar cell contacts the continuous one substrate and adjoins the insulating area.

10. The solar cell module of claim 1, wherein the transparent electrode and the transparent conductive layer are positioned on a first surface of the continuous one substrate, and a portion of the first surface of the continuous one substrate is exposed in the insulating area.

11. The solar cell module of claim 1, wherein the side portion of the silicon electricity generation layer of the outermost solar cell contacts one portion of the continuous one substrate and another portion of the silicon electricity generation layer of the outermost solar cell contacts another portion of the continuous one substrate.

* * * * *